United States Patent
Le et al.

(10) Patent No.: US 10,634,714 B2
(45) Date of Patent: Apr. 28, 2020

(54) APPARATUS AND METHOD FOR MONITORING AND PREDICTING RELIABILITY OF AN INTEGRATED CIRCUIT

(71) Applicant: INTEL CORPORATION, Santa Clara, CA (US)

(72) Inventors: Huy Le, Santa Clara, CA (US); Mona Mayeh, Portland, OR (US); Victor Zia, Portland, OR (US); Robert F. Kwasnick, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 901 days.

(21) Appl. No.: 15/051,571

(22) Filed: Feb. 23, 2016

(65) Prior Publication Data
US 2017/0242068 A1     Aug. 24, 2017

(51) Int. Cl.
*G01R 31/28*     (2006.01)
*H01L 21/66*     (2006.01)

(52) U.S. Cl.
CPC ......... *G01R 31/2858* (2013.01); *H01L 22/00* (2013.01); *H01L 22/30* (2013.01); *H01L 22/34* (2013.01); *H04Q 2213/13162* (2013.01)

(58) Field of Classification Search
CPC ................................................ G01R 31/2858
USPC ....................................................... 257/208
See application file for complete search history.

(56) References Cited

U.S. PATENT DOCUMENTS

| | | | | |
|---|---|---|---|---|
| 5,264,377 A | * | 11/1993 | Chesire | G01R 31/2642 438/11 |
| 6,603,321 B2 | * | 8/2003 | Filippi, Jr. | H01L 22/34 324/719 |
| 6,614,251 B2 | * | 9/2003 | Ootsuji | G01R 31/2853 324/762.01 |
| 6,724,214 B2 | * | 4/2004 | Manna | G01R 31/129 324/762.02 |
| 6,819,124 B1 | * | 11/2004 | Allee | G01R 31/2858 324/525 |

(Continued)

OTHER PUBLICATIONS

Li et al., "A Case Study of Electromigration Reliability From Design Point to System Operations" in Reliability Physics Symposium (IRPS), 2015 IEEE International, vol., No., pp. 2D.1.1-2D.1.6, Apr. 19-23, 2015 (6 pages).

*Primary Examiner* — Viet Q Nguyen
(74) *Attorney, Agent, or Firm* — Green, Howard & Mughal LLP

(57) ABSTRACT

Described is an apparatus which comprises: a first array of reliability monitors including first and second reliability monitors, wherein the first and second reliability monitors include first and second switches and first and second conductors, wherein the first and second switches are coupled to first and second conductors, respectively; and first and second comparators coupled to the first and second switches, respectively. Described is an apparatus which comprises: a conductor formed on a metal layer; a switch having a source terminal coupled to the conductor, and a drain terminal coupled to a power supply node, wherein the switch is controllable by a controller; and a comparator having a first input coupled to the power supply node and to the switch, wherein the comparator includes a second input coupled to an adjustable reference.

23 Claims, 6 Drawing Sheets

(56) References Cited

U.S. PATENT DOCUMENTS

| | | | | |
|---|---|---|---|---|
| 6,825,671 B1* | 11/2004 | Zhang | G01R 27/205 | 324/525 |
| 6,867,056 B1* | 3/2005 | Hau-Riege | H01L 22/34 | 324/71.1 |
| 6,870,386 B1* | 3/2005 | Golliher | G01R 27/02 | 324/762.02 |
| 7,339,390 B2* | 3/2008 | Cranford, Jr. | G01R 31/2858 | 257/E21.591 |
| 7,394,273 B2* | 7/2008 | Hsu | G01R 31/2858 | 324/750.3 |
| 7,471,101 B2* | 12/2008 | Cranford, Jr. | G01R 31/2858 | 257/E21.591 |
| 7,602,205 B2* | 10/2009 | Ullmann | G01R 31/2858 | 324/754.03 |
| 7,719,302 B2* | 5/2010 | Hsu | G01R 31/2858 | 324/754.01 |
| 7,749,778 B2* | 7/2010 | Chanda | G01R 31/2858 | 257/48 |
| 7,840,916 B2* | 11/2010 | Hsu | G06F 17/5036 | 716/133 |
| 7,888,961 B1* | 2/2011 | Brozek | G01R 31/2884 | 324/762.02 |
| 7,893,699 B2* | 2/2011 | Koerner | H01L 22/34 | 324/750.15 |
| 8,030,099 B2* | 10/2011 | De Ceuninck | G01R 31/2856 | 257/48 |
| 8,253,423 B2* | 8/2012 | Lee | G01R 31/2858 | 324/537 |
| 8,890,556 B2* | 11/2014 | Chen | G01R 31/3004 | 324/750.03 |
| 8,917,104 B2* | 12/2014 | Chen | G01R 31/2858 | 324/525 |
| 9,000,785 B2* | 4/2015 | Charbuillet | H01L 22/34 | 257/48 |
| 9,104,832 B1* | 8/2015 | Barwin, III | G06F 17/5081 | |
| 9,317,389 B2 | 4/2016 | Shapira et al. | | |
| 9,329,228 B2* | 5/2016 | Chen | G01R 31/2856 | |
| 9,733,302 B2* | 8/2017 | Zhang | G01R 31/2879 | |
| 9,742,477 B2* | 8/2017 | Wu | H04B 7/0456 | |
| 9,791,499 B2* | 10/2017 | Jenkins | G01R 31/2856 | |
| 9,851,397 B2* | 12/2017 | Chen | G01R 31/2858 | |
| 10,088,519 B1* | 10/2018 | Friend | G01R 31/2858 | |
| 10,191,108 B2* | 1/2019 | Freeman | G01R 31/2884 | |
| 10,234,499 B1* | 3/2019 | Dvorak | G01R 31/2884 | |
| 10,295,589 B2* | 5/2019 | Jenkins | G01R 31/2858 | |
| 10,298,236 B2* | 5/2019 | Tan | G11C 5/005 | |
| 2006/0066314 A1* | 3/2006 | Ahsan | H01L 22/34 | 324/519 |
| 2006/0267616 A1* | 11/2006 | Cranford, Jr. | G01R 31/2858 | 324/750.3 |
| 2009/0132985 A1* | 5/2009 | Hsu | G06F 17/5036 | 716/122 |
| 2009/0167336 A1* | 7/2009 | La Rosa | G01R 31/2858 | 324/750.3 |
| 2011/0102005 A1* | 5/2011 | Feng | G01R 31/2856 | 324/750.3 |
| 2015/0110158 A1* | 4/2015 | Liu | G01K 7/21 | 374/184 |
| 2017/0126229 A1* | 5/2017 | Tan | G11C 5/005 | |
| 2018/0156859 A1* | 6/2018 | Takeuchi | G01R 31/2642 | |

* cited by examiner

US 10,634,714 B2

APPARATUS AND METHOD FOR MONITORING AND PREDICTING RELIABILITY OF AN INTEGRATED CIRCUIT

BACKGROUND

There is a growing challenge in the area of electro-migration (EM) failure for integrated circuit (IC) products, driven mainly by aggressive scaling of interconnect wires. At a high level, EM is the transport of material caused by the gradual movement of the ions in a conductor due to the momentum transfer between conducting electrons and diffusing metal atoms. For example, EM is an electronic-current-induced diffusion due to an electron wind force on metal atoms in the interconnect wires and other conductors in integrated circuit products. This force originates from scattering events with flowing electrons, whereby atoms migrate via a vacancy exchange mechanism. EM is process-dependent, materials-dependent, and layout-specific and is accelerated by higher temperature and current density.

As devices shrink or scale down, power density and hence temperature rise for high performance circuits. At the same time, scaling interconnect pitch increases current density. Both higher temperature and current density result in an increased EM risk for future generations of semiconductor circuits.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
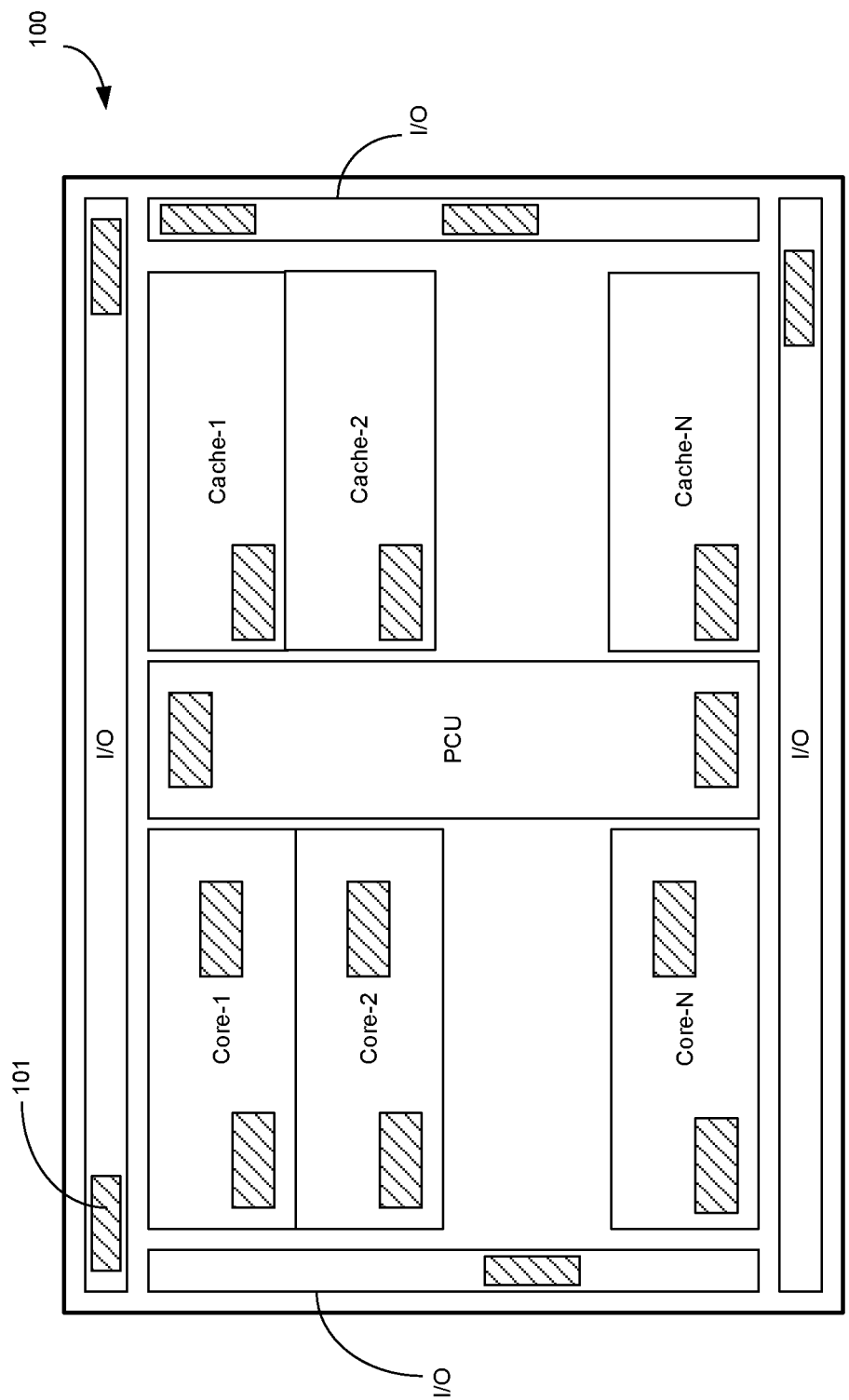
FIG. 1 illustrates a processor or an integrated circuit (IC) with multiple electro-migration (EM) monitors, according to some embodiments of the disclosure.

There are process related techniques to make device interconnect more robust to electro-migration (EM) while preserving small dimensions. For example, using alternate materials that are EM resistant and/or thicker barriers, etc. can make a device interconnect more robust to EM. However, using alternate materials other than conventional conducting materials such as copper, and application of thicker barriers to interconnects raises the cost of fabrication and may also introduce higher resistance or capacitance leading to increased resistance-capacitance (RC) delay, and therefore slowing the circuit(s), and hence lowering their possible performance. So there is a tradeoff that must be managed between performance and EM.

As part of the performance-EM design tradeoff, and in general in order to ensure product reliability for all failure mechanisms, it is prudent to understand product use conditions (UC). These UC include voltage, current, temperature, and percent-time-in-state the circuit is in a given operating state, for example on, standby/idle or off.

Collecting UC data while applying the information in real-time to circuit operation may be resource intensive (e.g., may need nonvolatile memory and complex functional forms). For example, collecting UC data may be done via a network of sensors and performance counters, and then this data may be integrated using some form of algorithmic mechanism (e.g., hardware function or software integration) and finally, the calculated results may be stored in an off-CPU location (e.g., persistent storage) for later analysis or decision making. Examples of such later analysis or decision making include prognostic indicator, or allowing increased turbo voltages if high Design Rule Violation (DRV) has not failed yet, or throttle the frequency/voltage if low DRV has failed already, etc., where DRV is a representation of EM sensitivity.

Various embodiments disclose an array of reliability monitors including first and second reliability monitors, where the first and second reliability monitors include first and second switches and first and second conductors, and where the first and second switches are coupled to first and second conductors, respectively. Various embodiments also include first and second comparators coupled to the first and second switches, respectively, such that the first and second comparators provide reliability indication to an operating system or other consumers.

In some embodiments, the various reliability monitors are stressed like portions of a chip are stressed. For example, some reliability monitors are connected to a core voltage and located in the core section of the chip while other reliability monitors are connected to other regions of interest. Here, core voltage represents the power supply provided for a processing core of a processor. The EM monitors of the various embodiments intrinsically have memory. For example, when the EM monitors are stressed/used, damage associated with the EM phenomenon builds up with time, ultimately leading to an open circuit, or nearly open circuit, and the accumulated stress is determined by the resistance having shifted significantly higher relative to its time zero value. As such, the reliability monitors serve as both sensors and storage elements of product aging. Monitoring when and which of these EM monitors fail over time provides insights into UC and the failure rate of the reliability mechanism of interest.

The EM monitors of the various embodiments can be used in a prognostic (e.g., predictive) manner, to guide how much EM life a given EM monitor in the field or section of a chip has remaining. For example, the EM monitors can provide the ability to predict that failure is imminent due to wear-out and aging. As such, a product with very high safety requirements can be enabled. For example, the EM monitor can be used to determine whether an automotive driver assistance system (ADAS) should be pulled from service or a warning should be made that it the ADAS needs to be replaced. Other technical effects will be evident by the description and figures of the various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "b" "bottom," "over," "under," and the like in the description and in the claims, if any, are used for descriptive purposes and not necessarily for describing permanent relative positions.

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, eFET, etc., may be used without departing from the scope of the disclosure.

FIG. 1 illustrates processor 100 or an integrated circuit (IC) with multiple EM monitors, according to some embodiments of the disclosure. In some embodiments, a plurality of EM monitors 101 (shown as shaded regions) are placed in various locations of processor 100. A processor may have a number of processing cores (e.g., Core-1 through Core-N, where 'N' is an integer), a number of memories (e.g., Cache-1 through Cache-N, where 'N' is an integer), a power control unit (PCU), input-output (I/O) circuits along the periphery, and other logic. Different regions of processor 100 may be connected to different power supplies. For example, the processing cores may receive different power supplies each, and the IOs may receive different power supplies. Different regions of processor 100 may be stressed differently.

For example, a logic region in Core-1 may be more active than a logic region in the I/O, but since the I/O may have a higher voltage of operation than Core-1, EM monitors 101 of Core-1 may be stressed lower than EM monitors of the I/O. As such EM monitors 101 are stressed like portions of the chips.

In some embodiments, EM monitors 101 are small or compact in size and can be placed around selected circuits or regions of the product (e.g., the floating point unit of Core-1), that are either sensitive to EM failure or are expected to be hot, for example. The behavior (e.g., increased resistance or complete open/failure) of EM Monitors 101 over time then provides insight into the temperature and voltage experienced by the product across the die, from which additional information about failure rates for EM and other failure mechanisms can be learned.

Depending on the kind of metal (e.g., layer type or level, thickness of the metal, width of the metal, length of the metal, and barrier material, etc.) and operating parameters (e.g., activity factor of the circuits using the metal, voltage level of the signals being carried by the metal, current level flowing through the metal, temperature of the metal, etc.), EM failure may take different times because the stress levels for the metal are different.

While the various EM monitors 101 are shown to be of the same type, they can be of different EM sensitivities, in accordance with some embodiments. For example, some EM monitors may comprise arrays of reliability monitors, where one or more of the reliability monitors may have different metal conductors for predicting or monitoring EM behavior. In some embodiments, an EM monitor 101 may have metals or conductors formed of a same metal layer (e.g., Metal layer 7 (M7)) type such that one metal conductor has a different length or width than a length or width of another metal conductor of the EM monitor. For example, all metal conductors of an EM monitor 101 may be formed in M7, but each metal conductor may be of different dimension to provide different levels of sensitivities to EM failure.

In some embodiments, an EM monitor 101 may have metals or conductors formed of different metal layer types (e.g., M7 and metal layer 5 (M5)) such that one metal conductor has a different length or width than a length or width of another metal conductor of the EM monitor. For example, some metal conductors of an EM monitor 101 may be formed in M7 while other metal conductors may be formed in M5, and each metal conductor of that EM monitor may be of different dimension to provide different levels of sensitivity to EM failure. In some embodiments, an EM monitor 101 may have metals or conductors formed of different metal layer types (e.g., M7 and M5) such that one metal conductor has a same length or width than a length or width of another metal conductor of the EM monitor. As such, depending on the circuit or logic region being monitored for possible reliability issues, various kinds of EM monitors may help predict the severity of the EM failure in those regions.

In some embodiments, EM monitors 101 can also be used in conjunction with existing or traditional EM sensors to provide additional knowledge about product use conditions. The physical structure of EM monitors 101 of the various embodiments serves as both the sensors and the storage elements of the product aging. In some embodiments, EM monitors 101 provide direct prognostic information about EM failure of a specific unit of the product by observing the metal structures of different EM sensitivities fail, and that information can be used to send a signal to take the unit out of service, for critical applications like Automotive Driving Assist Systems (ADAS).

Figure 2:
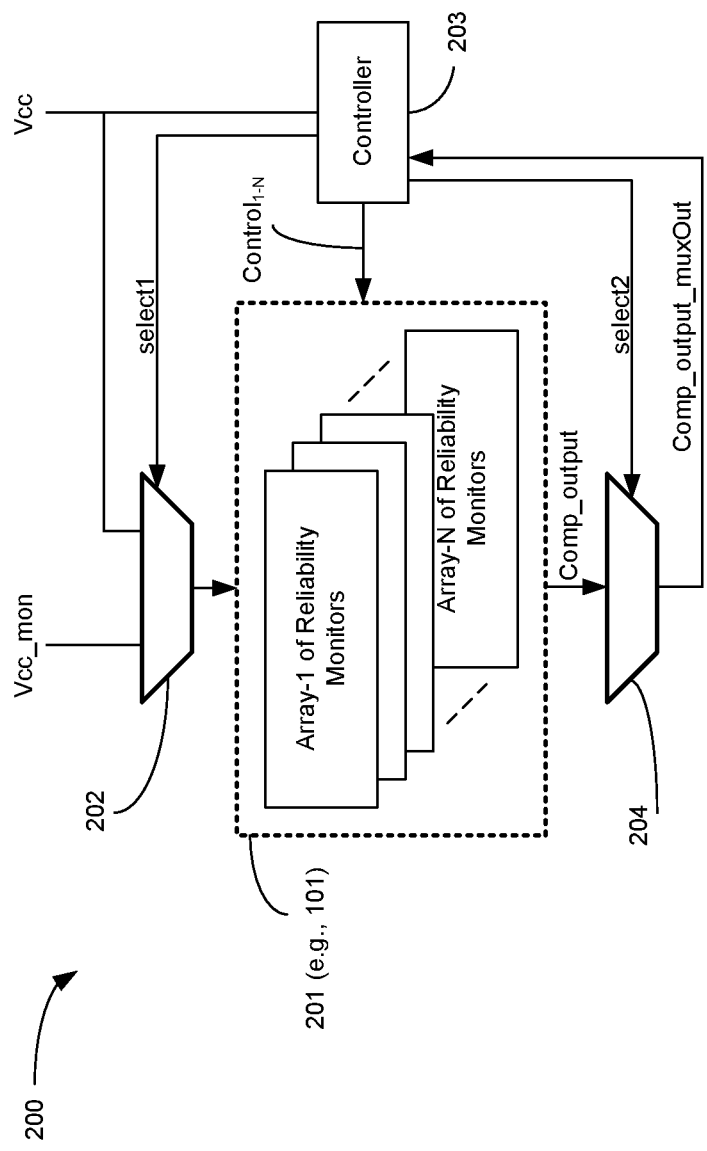
FIG. 2 illustrates a high-level architecture with EM monitors, according to some embodiments of the disclosure.

FIG. 2 illustrates a high-level architecture 200 with EM monitors, according to some embodiments of the disclosure. It is pointed out that those elements of FIG. 2 having the same reference numbers (or names) as the elements of any other figure can operate or function in any manner similar to that described, but are not limited to such.

In some embodiments, architecture 200 for managing EM monitors comprises a plurality of arrays of reliability monitors 201 (e.g., Array-1 through Array-N, where 'N' is an integer), supply multiplexer 202, Controller 203, and output multiplexer 204. In some embodiments, one or more shaded regions 101 (or EM monitors 101) of FIG. 1 is the same as architecture 200. In some embodiments, one or more shaded regions 101 (or EM monitors 101) of FIG. 1 is the same part of architecture 200. For example, one or more shaded regions 101 (or EM monitors 101) of FIG. 1 may exclude Controller 203 which is shared with other EM monitors 101. In some embodiments, one or more shaded regions 101 (or EM monitors 101) of FIG. 1 are section 201 of FIG. 2. In some embodiments, one or more shaded regions 101 (or EM monitors 101) of FIG. 1 merely have one array of reliability monitors (e.g., Array-1).

Referring back to FIG. 2, in some embodiments, supply multiplexer 202 is controllable by Controller 203 via select1 bus to provide $Vcc\_mon_{1-N}$ or Vcc to the plurality of arrays of reliability monitors 201, where Vcc is the always-on power supply which is low enough to keep Controller 203 powered on while $Vcc\_mon_{1-N}$ is the variable supply (e.g., 0.9 V-1.5 V) which changes according to processor performance requirements.

In some embodiments, some of the arrays of reliability monitors of the plurality 201 are coupled to a constant-voltage-always-on power supply (Vcc) in a cool spot of processor 100 (or die 100). In some embodiments, some of the array of reliability monitors of the plurality 201 are coupled to the same constant-voltage-always-on supply, but in the processor core (e.g., a hot spot of Core-1). In some embodiments, some of the array of reliability monitors of the plurality 201 are coupled to a core supply and are positioned in the core hot-spot (e.g., hot-spot of Core-1). In this configuration of spreading the arrays of reliability monitors of the plurality 201 in hot and cool spots of processor 100, the failure of each EM monitor of the arrays can be deconvolved to infer the EM failure rate of the core (e.g., Core-1).

In some embodiments, Controller 203 also controls when to provide $Vcc\_mon_{1-N}$ to the Arrays. For instance, during turbo-mode (e.g., high performance mode of the processor), most if not all arrays of 201 may receive the highest level (e.g., 1.5 V) for $Vcc\_mon_{1-N}$ which represents the turbo-mode power supply level. In non-turbo modes, some arrays (depending on where they are located in processor 100) may receive different power supplies. For example, Array-1 may receive $Vcc\_mon_1$ which is 1.1 V, Array-2 may receive $Vcc\_mon_2$ which is 0.9 V, etc.

As such, when Vcc_mon is of a first specific range (e.g., 0.9 V-1.0 V), Array-1 is selected which is configured to provide EM prediction based on a power supply of that range (e.g., 0.9 V-1.0 V). In this example, all other Arrays that are not configured to provide EM prediction based on that power supply range are not selected by Controller 203. In another example, when Vcc_mon is of a second specific range (e.g., 1.1 V-1.3 V), Array-2 is selected which is configured to provide EM prediction based on a power supply of that range (e.g., 1.1 V-1.3 V). In this example, all other Arrays that are not configured to provide EM prediction based on that power supply range are not selected by Controller 203. As such, a complete history of voltage time-in-state for the Vcc_mon supply of interest can be inferred, in accordance with some embodiments.

In some embodiments, Controller 203 generates $Control_{1-N}$ signal(s) (which may be a bus) to enable/disable various arrays of reliability monitors and/or the cells in the arrays. In some embodiments, Controller 203 is a logic unit which is either part of the PCU or separate. In some embodiments, the output Comp_output from arrays 201 are received by output multiplexer 204 and then a selected one of the output Comp_output is provided as Comp_output_muxOut according to the select2 signal. In some embodiments, Controller 203 also controls output multiplexer 204 via the select2 signal(s) to analyze the output Comp_ouput_muxOut from a particular array. Here, select1 and select2 signals may be a multi-bit bus.

In another embodiment, the correlation between the failure rate of the EM monitors and those of the product's due to mechanisms other than EM (e.g., gate oxide time dependent dielectric breakdown (TDDB), etc.), can be used in a prognostic manner to predict the failure of the product.

Figure 3:
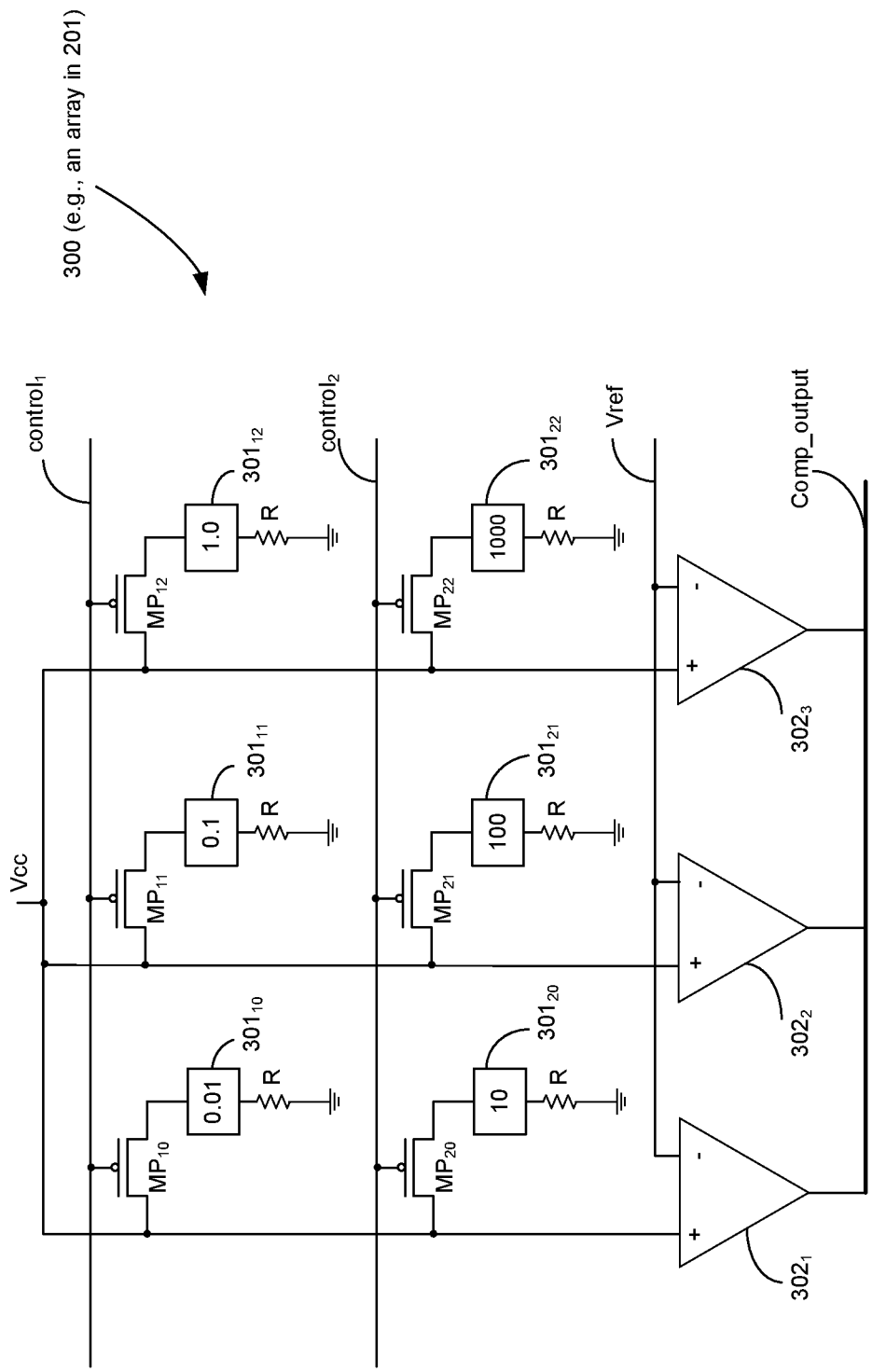
FIG. 3 illustrates a schematic of an array of EM monitors, according to some embodiments of the disclosure.

FIG. 3 illustrates schematic 300 of an array of EM monitors (e.g., 101 or 201), according to some embodiments of the disclosure. It is pointed out that those elements of FIG. 3 having the same reference numbers (or names) as the elements of any other figure can operate or function in any manner similar to that described, but are not limited to such.

In some embodiments, schematic 300 comprises a plurality of switches (e.g., $MP_{10}$-$MP_{22}$) organized in rows and columns as shown. Here, the switches are implemented as p-type transistor pass-gates. In other embodiments, other types of transistors (e.g., n-type pass gate in parallel to the p-type pass gate may be used). In some embodiments, each switch is coupled at one end to a power supply node Vcc_mon (which is shown as Vcc here) and coupled to a metal conductor at another end. In some embodiments, the metal conductors (e.g., $301_{10}$-$301_{22}$) are of same or different EM sensitivity, which is indicated by the number in the boxes representing the metal conductors.

The EM sensitivity can be represented as a Design Rule Violation (DRV), in accordance with some embodiments. In some embodiments, EM sensitivity of DRV=1 is designed to meet a design rule at a certain condition which represents the product use-life, and therefore would have an expected failure rate (e.g., lower than 0.1%) and can be derived from silicon data during process certification. In some embodiments, EM sensitivity of DRV=2 is designed to experience higher EM demand and violate the design rule by 2×, and therefore it has a higher failure rate than a monitor with DRV=1, and so on for higher DRV values. As such, an EM monitor with high DRV, given the same use conditions, has higher probability of failure (e.g., shorter lifetime) as compared to EM monitor with EM sensitivity of DRV=1.

In some embodiments, by adjusting the length and width of each metal conductor, a desired degree of DRV may be achieved. The EM monitor cells (for example, with DRVs varying from about 25 to about 1000) may be organized in an array, with the ability to sense which EM monitor cell has shifted (or failed), and by how much, using additional control circuitry, in accordance with some embodiments. Calibration of the EM monitor cells to actual conditions of interest may be done as follows, in accordance with some embodiments.

Each EM monitor cell can be designed such that DRV=X1 (where "X1" is a value in the above noted range) will fail if Vcc_mon=V1 has been applied for a duration of time T1. Similarly, an EM monitor cell with DRV=X2 will fail if Vcc_mon=V1 is applied for a duration of time T2, and so on. An array of EM monitor cells built in the manner described can give a time-in-state information about Vcc_mon=V1, in accordance with some embodiments.

In some embodiments, the switches are controlled by Controller 203. For example, gate terminals of switches in one row are controlled by one bit of the control signal while gate terminals of switches in another row are controlled by another bit of the control signal. In this example, gate terminals of $MP_{10}$, $MP_{11}$, and $MP_{12}$ are controlled by $control_1$, while gate terminals of $MP_{20}$, $MP_{21}$, and $MP_{22}$ are controlled by $control_2$, where $control_1$ and $control_2$ are two bits of the control bus provided by Controller 203.

While FIG. 3 is illustrated by an array with six EM monitor cells, any number of EM monitor cells may be used for forming an array, where an EM monitor cell comprises a switch, a metal conductor of certain DRV or EM sensitivity, and a resistor to ground. In some embodiments, the resistor coupled to each metal conductor of the EM monitor cell indicates resistance of a terminal coupled to ground and to the metal conductor.

In some embodiments, schematic 300 comprises a plurality of comparators (e.g., $302_{1-3}$) which are coupled to the EM monitor cells. Any known voltage comparator design can be used to implement the plurality of comparators. In this example, non-inverting input of comparator $302_1$ is coupled to the switches of the first column of EM monitor cells (e.g., switches $MP_{10}$ and $MP_{20}$), non-inverting input of comparator $302_2$ is coupled to the switches of the second column of EM monitor cells (e.g., switches $MP_{11}$ and $MP_{21}$), and non-inverting input of comparator $302_3$ is coupled to the switches of the third column of EM monitor cells (e.g., switches $MP_{12}$ and $MP_{22}$). In some embodiments, the inverting input of the comparators (e.g., $302_{1-3}$) is coupled to an adjustable reference voltage Vref.

In some embodiments, the reference voltage is swept from a low voltage (e.g., 0 V) to a high voltage (e.g., 1.5 V) to determine the resistance of the selected EM monitor cells. In some embodiments, the output of the comparators is received by Comp_output which is analyzed by Controller 203 and/or other logic to predict EM failures in the metal conductors with various EM sensitivities.

Table 1 shows an example of monitor failures at various read-out times and how the higher DRV ones will fail (F) first. Time( ) represents the beginning of product lifetime, Time1 represents the time approaching product use-life, and Time2 represents beyond the product's intended use-life.

TABLE 1

| No. | DRV | Time0 (T0) | Time1 (T1) | Time (T2) |
|---|---|---|---|---|
| 1 | 1000 | P | F | F |
| 2 | 100 | P | F | F |
| 3 | 10 | P | F | F |
| 4 | 1.0 | P | P | F |
| 5 | 0.1 | P | P | F |
| 6 | 0.01 | P | P | P |

Figures 4A, 4B:
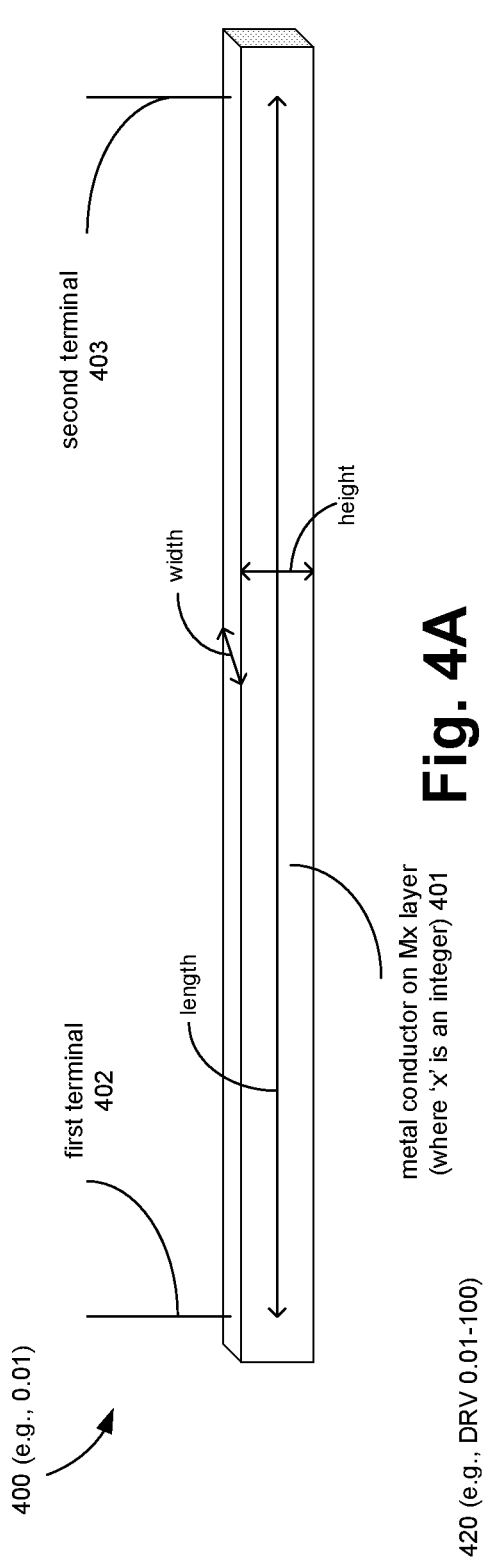
FIG. 4A illustrates a two terminal fixed length conductor used for monitoring or predicting EM, according to some embodiments of the disclosure.
FIG. 4B illustrates a two terminal configurable length conductor used for monitoring or predicting EM, according to some embodiments of the disclosure.

FIG. 4A illustrates a two terminal fixed length conductor 400 (e.g., DRV 0.01) used for monitoring or predicting EM, according to some embodiments of the disclosure. It is pointed out that those elements of FIG. 4A having the same reference numbers (or names) as the elements of any other figure can operate or function in any manner similar to that described, but are not limited to such. Each conductor in the EM monitor cell is a two terminal metal conductor. Here, the two terminal conductor 401 has a first terminal 402 which is coupled to a low potential (e.g., ground via resistor R) and a second terminal 403 which is coupled to the switch (e.g., $MP_{10}$). The EM sensitivity may depend on a number of factors such as length, width, height, metal layer type (Mx, where 'x' is an integer), etc.

FIG. 4B illustrates a two terminal configurable length conductor 420 used for monitoring or predicting EM, according to some embodiments of the disclosure. It is pointed out that those elements of FIG. 4B having the same reference numbers (or names) as the elements of any other figure can operate or function in any manner similar to that described, but are not limited to such.

In some embodiments, multiplexer 421 is provided which is operable to select one of the taps that represent various lengths of the metal conductor. In this example, a 4:1 multiplexer is shown with four input taps (e.g., tap1, tap2, tap3, and tap4), where tap 1 corresponds to length1 of metal conductor 401, tap 2 corresponds to length2 of metal conductor 401, tap 3 corresponds to length3 of metal conductor 401, and tap 4 corresponds to length4 of metal conductor 401, where length4 is greater than length3, length3 is greater than length2, and length2 is greater than length1. In other embodiments, other types of multiplexers may be used. For example, a 2:1 multiplexer, a 3:1 multiplexer, a 5:1 multiplexer, etc. may be used to provide configurable lengths for EM monitoring. In some embodiments, multiplexer 421 is controlled by Controller 203 via select3 signal or bus. In some embodiments, the DRV (e.g., the EM sensitivity) of the conductor 401 ranges according to the selected tap. For example DRV may range between 0.01 and 25 depending on which tap is selected by Controller 203.

Figure 5:
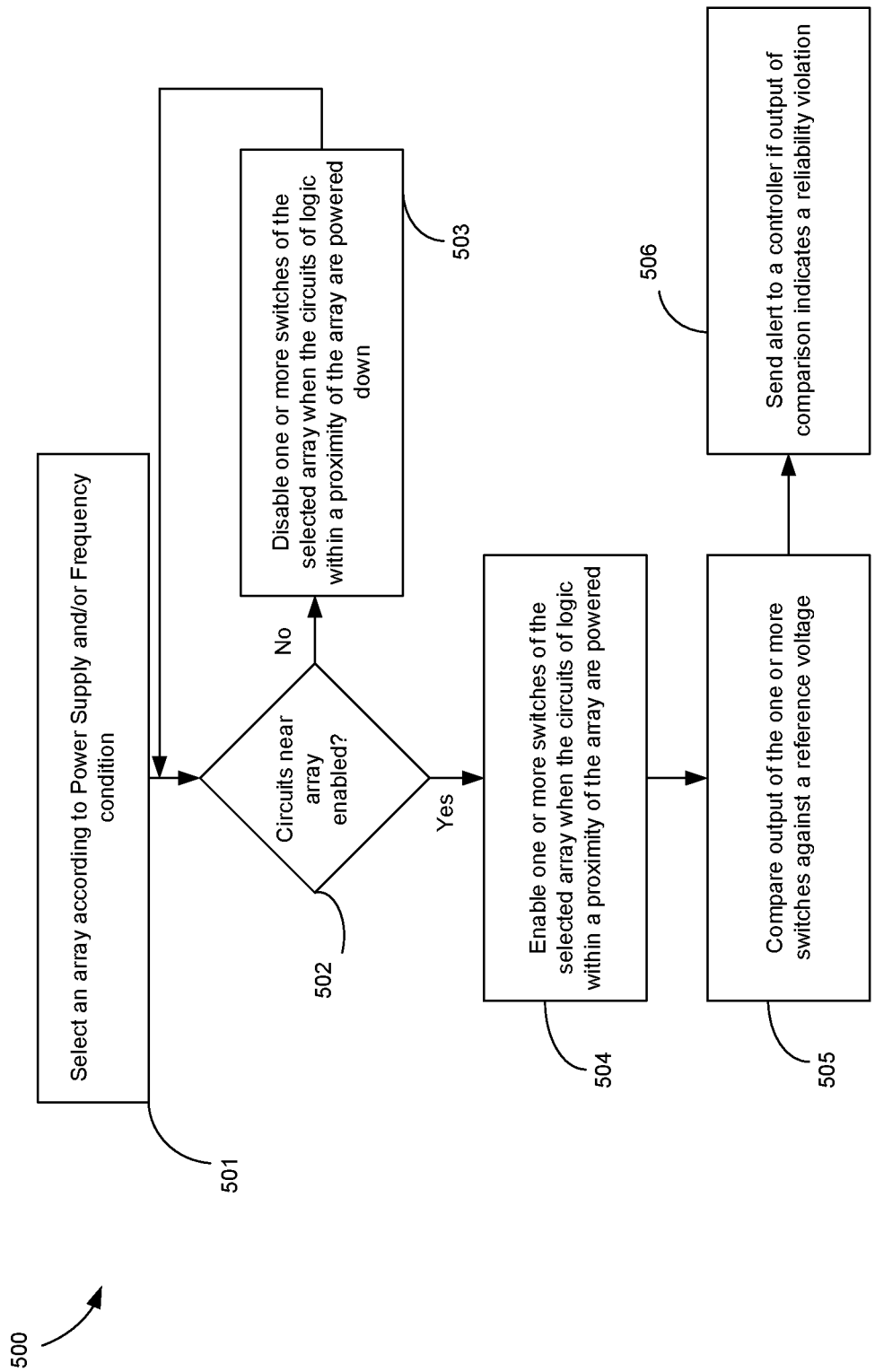
FIG. 5 illustrates a flowchart of a method for monitoring or predicting EM, according to some embodiments of the disclosure.

FIG. 5 illustrates a flowchart of a method 500 for monitoring or predicting EM, according to some embodiments of the disclosure. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, Controller 203 selects an array from among the plurality of arrays according to a performance criterial (e.g., power supply and/or frequency condition of processor 100). At block 502, Controller 203 determines whether circuits or logic in close proximity to the selected array are active or enabled. If the circuits are active, Controller 203 provides the appropriate voltage supply Vcc_mon to the selected array, and the process proceeds to block 504. At block 504, one or more switches of the selected array are enabled by Controller 203. At block 505, the comparators compare the output of the one or more switches (which are coupled to a power supply node) against a reference voltage Vref. At block 506, the output of the comparator(s) are evaluated by Controller 203 (or another other logic) to determine if EM failure occurred. If the output of the comparator(s) indicates a reliability violation, then an alert is sent to Controller 203 to indicate an EM violation.

If the circuits are inactive, then Controller 203 removes the power supply from the selected array and the process proceeds to block 503. At block 503, Controller 203 disables one or more switches to the selected array because the circuits in close proximity are powered down and there is little value in continuing with the EM process for the metal conductors of that selected array. The process then proceeds to block 502, and continues on.

Figure 6:
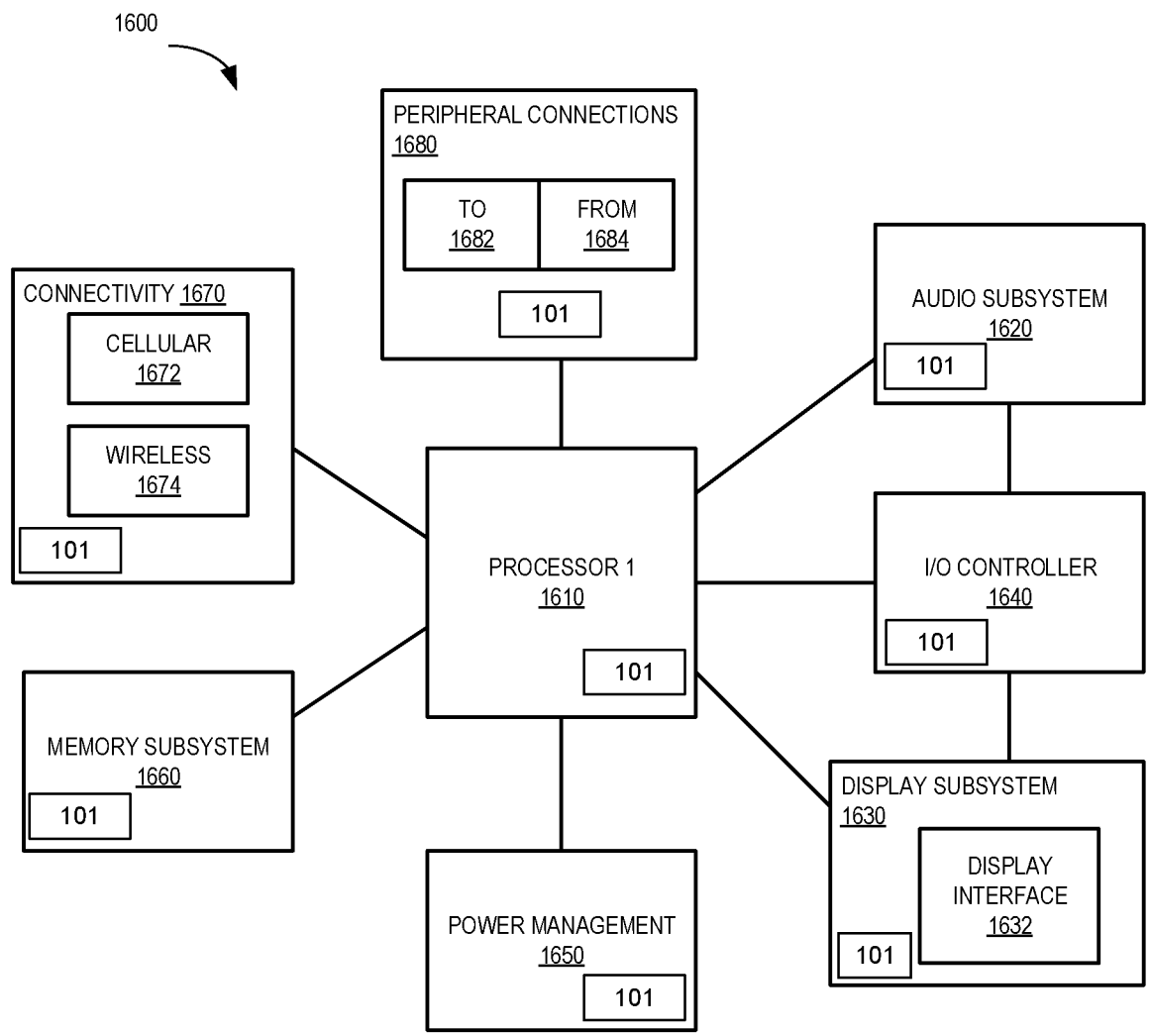
FIG. 6 illustrates a smart device or a computer system or a SoC with apparatus to monitor and/or predict EM, according to some embodiments.

FIG. 6 illustrates a smart device or a computer system or a SoC with apparatus 200 (or 101) to monitor and/or predict EM, according to some embodiments. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with apparatus 200 (or 101) to monitor and/or predict EM, according to some embodiments discussed. Other blocks of the computing device 1600 may also include apparatus 200 (or 101) to monitor and/or predict EM, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. In some embodiments, audio subsystem 1620 includes apparatus 200 (or 101) to monitor and/or predict EM. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. In some embodiments, Display subsystem 1630 includes apparatus 200 (or 101) to monitor and/or predict EM. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. In some embodiments, I/O controller 1640 includes apparatus 200 (or 101) to monitor and/or predict EM. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. In some embodiments, power management 1650 includes apparatus 200 (or 101) to monitor and/or predict EM. Memory subsystem 1660 includes memory devices for storing information in computing device 1600. In some embodiments, Memory subsystem 1660 includes apparatus 200 (or 101) to monitor and/or predict EM. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. In some embodiments, Connectivity 1670 includes apparatus 200 (or 101) to monitor and/or predict EM. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. In some embodiments, Peripheral connections 1680 includes apparatus 200 (or 101) to monitor and/or predict EM. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus which comprises: a first array of reliability monitors including first and second reliability monitors, wherein the first and second reliability monitors include first and second switches and first and second conductors, wherein the first and second switches are coupled to the first and second conductors, respectively; and first and second comparators coupled to the first and second switches, respectively. In some embodiments, the first and second switches are coupled to a power supply node.

In some embodiments, the apparatus comprises a controller to control when to turn on or off the first and second switches. In some embodiments, one end of the first conductor is coupled to the first switch while a second end of the first conductor is coupled to ground, and wherein one end of the second conductor is coupled to the second switch while a second end of the second conductor is coupled to ground. In some embodiments, the apparatus comprises a reference node coupled to the first and second comparators, wherein the reference node is to provide a reference voltage which is operable to be varied.

In some embodiments, the first and second conductors are formed of a same metal layer type such that the first conductor has a different length or width than a length or width of the second conductor. In some embodiments, the first and second conductors are formed of different metal layer types such that the first conductor has a different length or width than a length or width of the second conductor. In some embodiments, the first and second conductors are formed of different metal layer types such that the first conductor has a same length or width as a length or width of the second conductor.

In some embodiments, the first reliability monitor includes a multiplexer which is operable to select one of various locations of the first conductor to electrically couple to the first switch, and wherein each location of the various locations is to indicate a different conducting length of the first conductor. In some embodiments, the apparatus comprises: a second array of reliability monitors including first and second reliability monitors, wherein the first and second reliability monitors of the second array include first and second switches and first and second conductors, wherein the first and second switches of the second array are coupled to first and second conductors of the second array, respectively; and a multiplexer which is operable to enable one of the first and second arrays of reliability monitors according to one or more performance conditions indicated by a controller. In some embodiments, the one or more performance conditions include at least one of: power supply level and clock frequency.

In another example, an apparatus is provided which comprises: a conductor formed on a metal layer; a switch having a source terminal coupled to the conductor, and a drain terminal coupled to a power supply node, wherein the switch is controllable by a controller; and a comparator having a first input coupled to the power supply node and to the switch, wherein the comparator includes a second input coupled to an adjustable reference. In some embodiments, the controller is to turn on the switch to electrically couple the conductor to the power supply node when one or more circuits in a region of the conductor are active.

In some embodiments, the controller is to turn off the switch to electrically uncouple the conductor from the power supply node when the one or more circuits in the region of the conductor are inactive. In some embodiments, the apparatus comprises: a multiplexer which is operable to select one of various locations of the conductor to electrically couple the conductor to the switch, and wherein each location of the various locations is to indicate a different conducting length of the conductor. In some embodiments, an output of the comparator is to be received by a logic which is operable to alert or predict a reliability indicator associated with the conductor. In some embodiments, the reliability indicator is electro-migration.

In another example, a system is provided which comprises: a memory; a processor coupled to the memory, the processor including: a processing core which includes: a first array of electro-migration (EM) monitors including first and second EM monitors, wherein the first and second EM monitors include first and second switches and first and second conductors, wherein the first and second switches are coupled to the first and second conductors, respectively; and first and second comparators coupled to the first and second switches, respectively; and an input-output (IO) domain coupled to the processing core and located along a periphery of the processor, wherein the IO domain includes: a second array of EM monitors including first and second EM monitors, wherein the first and second EM monitors of the second array include first and second switches and first and second conductors, wherein the first and second switches are coupled to the first and second conductors, respectively; and third and fourth comparators coupled to the third and fourth switches, respectively; and a wireless interface for allowing the processor to communicate with another device.

In some embodiments, the first EM monitor of the first array includes a multiplexer which is operable to select one of various locations of the first conductor to electrically couple to the first switch, and wherein each location of the various locations is to indicate a different conducting length of the first conductor. In some embodiments, outputs of the first, second, third, and fourth comparators are to be received by a logic which is operable to alert or predict reliability indicators associated with the processing core and the IO domain. In some embodiments, the first and second conductors are formed of different metal layer types such that the first conductor has a same length or width as a length or width of the second conductor. In some embodiments, the first and second conductors are formed of different metal layer types such that the first conductor has a different length or width than a length or width of the second conductor. In some embodiments, the first and second conductors are formed of same metal layer type such that the first conductor has a different length or width than a length or width of the second conductor.

In another example, a method is provided which comprises: selecting an array of electro-migration (EM) monitors according to an operating condition; determining whether circuits near the array are enabled; and enabling or disabling one or more switches of the selected array according to the determining. In some embodiments, the method comprises: disabling the one or more switches of the selected array when it is determined that the circuits near the array are not enabled. In some embodiments, the method comprises: enabling the one or more switches of the selected array when it is determined that the circuits near the array are enabled. In some embodiments, the method comprises: comparing an output of the one or more switches against a reference voltage. In some embodiments, the method comprises: sending an alert if an output of the comparing operation indicates a reliability violation.

In another example, an apparatus is provided which comprises: means for selecting an array of electro-migration (EM) monitors according to an operating condition; means for determining whether circuits near the array are enabled; and means for enabling or disabling one or more switches of the selected array according to the determining. In some embodiments, the apparatus comprises means for disabling the one or more switches of the selected array when it is determined that the circuits near the array are not enabled. In some embodiments, the apparatus comprises means for enabling the one or more switches of the selected array when it is determined that the circuits near the array are enabled. In some embodiments, the apparatus comprises means for comparing an output of the one or more switches against a reference voltage. In some embodiments, the apparatus comprises means for sending an alert if an output of the means for comparing indicates a reliability violation.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first array of reliability monitors including first and second reliability monitors, wherein the first and second reliability monitors include first and second switches and first and second conductors, and wherein the first and second switches are coupled to the first and second conductors, respectively; and
   first and second comparators coupled to the first and second switches, respectively,
   wherein the first reliability monitor includes a multiplexer which is to select one of various locations of the first conductor to electrically couple to the first switch.

2. The apparatus of claim 1, wherein the first and second switches are coupled to a power supply node.

3. The apparatus of claim 1 comprises a controller to control when to turn on or off the first and second switches.

4. The apparatus of claim 1, wherein one end of the first conductor is coupled to the first switch while a second end of the first conductor is coupled to ground, and wherein one end of the second conductor is coupled to the second switch while a second end of the second conductor is coupled to ground.

5. The apparatus of claim 1 comprises a reference node coupled to the first and second comparators, wherein the reference node is to provide a reference voltage which is operable to be varied.

6. The apparatus of claim 1, wherein the first and second conductors are of a same metal layer type such that the first conductor has a different length or width than a length or width of the second conductor.

7. The apparatus of claim 1, wherein the first and second conductors are of different metal layer types such that the first conductor has a different length or width than a length or width of the second conductor.

8. The apparatus of claim 1, wherein the first and second conductors are of different metal layer types such that the first conductor has a same length or width as a length or width of the second conductor.

9. The apparatus of claim 1, wherein each location of the various locations is to indicate a different conducting length of the first conductor.

10. The apparatus of claim 1 comprises:
    a second array of reliability monitors including first and second reliability monitors, wherein the first and second reliability monitors of the second array include first and second switches and first and second conductors, and wherein the first and second switches of the second array are coupled to first and second conductors of the second array, respectively; and
    a multiplexer which is operable to enable one of the first and second arrays of reliability monitors according to one or more performance conditions indicated by a controller.

11. The apparatus of claim 10, wherein the one or more performance conditions include at least one of: power supply level and clock frequency.

12. An apparatus comprising:
    a conductor on a metal layer;
    a switch having a source terminal coupled to the conductor, and a drain terminal coupled to a power supply node, wherein the switch is controllable by a controller; and
    a comparator having a first input coupled to the power supply node and to the switch, wherein the comparator includes a second input coupled to an adjustable reference.

13. The apparatus of claim 12, wherein the controller is to turn on the switch to electrically couple the conductor to the power supply node when one or more circuits in a region of the conductor are active.

14. The apparatus of claim 13, wherein the controller is to turn off the switch to electrically uncouple the conductor from the power supply node based on the one or more circuits in the region of the conductor being inactive.

15. The apparatus of claim 12 comprises a multiplexer which is to select one of various locations of the conductor to electrically couple the conductor to the switch, wherein each location of the various locations is to indicate a different conducting length of the conductor.

16. The apparatus of claim 12, wherein an output of the comparator is to be received by a logic which is operable to alert or predict a reliability indicator associated with the conductor.

17. The apparatus of claim 16, wherein the reliability indicator is electro-migration.

18. A system comprising:
    a memory;
    a processor coupled to the memory, the processor including:
        a processor core which includes:
            a first array of electro-migration (EM) monitors including first and second EM monitors, wherein the first and second EM monitors include first and second switches and first and second conductors, wherein the first and second switches are coupled to the first and second conductors, respectively; and
            first and second comparators coupled to the first and second switches, respectively; and
        an input-output (IO) domain coupled to the processor core and located along a periphery of the processor, wherein the IO domain includes:
            a second array of EM monitors including first and second EM monitors, wherein the first and second EM monitors of the second array include first and second switches and first and second conductors, wherein the first and second switches are coupled to the first and second conductors, respectively; and
            third and fourth comparators coupled to the third and fourth switches, respectively; and
    a wireless interface to allow the processor to communicate with another device.

19. The system of claim 18, wherein the first EM monitor of the first array includes a multiplexer which is to select one of various locations of the first conductor to electrically couple to the first switch, and wherein each location of the various locations is to indicate a different conducting length of the first conductor.

20. The system of claim 18, wherein outputs of the first, second, third, and fourth comparators are to be received by a logic which is operable to alert or predict reliability indicators associated with the processing core and the IO domain.

21. The system of claim 18, wherein:
the first and second conductors are of different metal layer types such that the first conductor has a same length or width as a length or width of the second conductor;
the first and second conductors are of different metal layer types such that the first conductor has a different length or width than a length or width of the second conductor; or
the first and second conductors are of same metal layer type such that the first conductor has a different length or width than a length or width of the second conductor.

22. An apparatus comprising:
a first array of reliability monitors including first and second reliability monitors, wherein the first and second reliability monitors include first and second switches and first and second conductors, and wherein the first and second switches are coupled to the first and second conductors, respectively; and
first and second comparators coupled to the first and second switches, respectively,
wherein the first and second conductors are of a same metal layer hierarchy such that the first conductor has a different length or width than a length or width of the second conductor.

23. The apparatus of claim 22, wherein the first and second switches are coupled to a power supply node, and wherein the first reliability monitor includes a multiplexer which is to select one of various locations of the first conductor to electrically couple to the first switch.

* * * * *